United States Patent
Seong et al.

(10) Patent No.: US 8,040,449 B2
(45) Date of Patent: Oct. 18, 2011

(54) THIN FILM TRANSISTOR ARRAY PANEL AND MANUFACTURING METHOD OF THE SAME

(75) Inventors: Seok-Je Seong, Yongin-si (KR); Yoon-Seok Choi, Suwon-si (KR); Hyung-Don Na, Seoul (KR)

(73) Assignee: Samsung Electronics Co., Ltd. (KR)

( * ) Notice: Subject to any disclaimer, the term of this patent is extended or adjusted under 35 U.S.C. 154(b) by 415 days.

(21) Appl. No.: 12/421,095

(22) Filed: Apr. 9, 2009

(65) Prior Publication Data
US 2009/0278128 A1 Nov. 12, 2009

(30) Foreign Application Priority Data
May 9, 2008 (KR) .......................... 10-2008-0043611

(51) Int. Cl.
G02F 1/136 (2006.01)
G02F 1/1343 (2006.01)
H01L 27/01 (2006.01)
(52) U.S. Cl. .......................................... 349/43; 257/350
(58) Field of Classification Search .............. 349/42–46, 349/144; 257/59, 72, 350, 797
See application file for complete search history.

(56) References Cited

U.S. PATENT DOCUMENTS

| | | | | |
|---|---|---|---|---|
| 5,990,999 A * | 11/1999 | Yeo | ................. | 349/139 |
| 6,555,876 B2 * | 4/2003 | Jun et al. | ................. | 257/350 |
| 7,116,383 B2 * | 10/2006 | Kim et al. | ................. | 349/44 |
| 7,582,903 B2 * | 9/2009 | Hong et al. | ................. | 257/72 |
| 7,675,065 B2 * | 3/2010 | You et al. | ................. | 257/59 |
| 7,843,522 B2 * | 11/2010 | Hur | ................. | 349/46 |
| 7,973,864 B2 * | 7/2011 | Kim | ................. | 349/38 |
| 2003/0020847 A1 * | 1/2003 | Kim et al. | ................. | 349/43 |
| 2007/0008445 A1 * | 1/2007 | Hur | ................. | 349/43 |
| 2010/0127249 A1 * | 5/2010 | Kim et al. | ................. | 257/40 |

* cited by examiner

*Primary Examiner* — Akm Ullah
(74) *Attorney, Agent, or Firm* — Cantor Colburn LLP

(57) ABSTRACT

A thin film transistor array panel includes a substrate; a gate electrode formed on the substrate; a data line formed on the substrate; a gate insulating layer formed on the data line and the gate electrode, and having a first contact hole exposing the gate electrode, and a second contact hole exposing the data line; a gate line intersecting the data line, and connected to the gate electrode through the first contact hole; a semiconductor formed the gate insulating layer, and including a channel of a thin film transistor; a source electrode connected to the data line through the second contact hole; a drain electrode opposite to the source electrode with respect to the channel on the semiconductor; a passivation layer having a third contact hole exposing the drain electrode; and a pixel electrode connected to the drain electrode through the third contact hole are included.

19 Claims, 17 Drawing Sheets

THIN FILM TRANSISTOR ARRAY PANEL AND MANUFACTURING METHOD OF THE SAME

This application claims priority to Korean Patent Application No. 10-2008-0043611 filed on May 9, 2008, and all the benefits accruing therefrom under 35 U.S.C. §119, the contents of which in its entirety are herein incorporated herein by reference.

BACKGROUND OF THE INVENTION (a) Field of the Invention

This disclosure relates to a thin film transistor array panel and a manufacturing method thereof.

(b) Description of the Related Art

A thin film transistor is used as a switching element to independently drive each pixel in a flat panel display, such as a liquid crystal display or an organic light emitting device. A thin film transistor array panel includes a thin film transistor, a scanning signal line (or a gate line) for transmitting a scanning signal to the thin film transistor, a data line for transmitting a data signal, and a pixel electrode connected thereto.

In commercially available embodiments, the data line is disposed intersecting the gate line such that a parasitic capacitance is generated between the data line and the pixel electrode close thereto, and as a result the charged voltage of the pixel electrode is unstable.

To form the thin film transistor array panel, several photolithography processes are required, and one photolithography process includes a detailed process of several tens to several hundreds of steps such that if the number of the photolithography processes is increased, the process time and the cost are increased. Accordingly, various methods to reduce the number of photolithography processes have been proposed. However, there are problems accompanied with reducing the number of photolithography processes, such that it is not easy to reduce the number of photolithography processes. Accordingly, it is desirable to have a process with a reduced number of photolithography processes without additional complications.

BRIEF SUMMARY OF THE INVENTION

The disclosed embodiments reduce the parasitic capacitance between the pixel electrode and the data line.

The disclosed embodiments reduce the number of photolithography processes in the manufacturing method of the thin film transistor array panel.

The above described and other drawbacks are alleviated by a thin film transistor array panel including: a substrate; a gate electrode formed on the substrate; a data line formed on the substrate; a gate insulating layer formed on the data line and the gate electrode, the gate insulating layer having a first contact hole exposing the gate electrode and a second contact hole exposing the data line; a gate line formed on the gate insulating layer, the gate line intersecting the data line, and electrically connected to the gate electrode through the first contact hole; a semiconductor formed on the gate insulating layer, the semiconductor including a channel of a thin film transistor; a source electrode formed on the semiconductor, the source electrode electrically connected to the data line through the second contact hole; a drain electrode opposite to the source electrode with respect to the channel on the semiconductor; a passivation layer formed on the gate line, the source electrode, the drain electrode, and the channel of the semiconductor, the passivation layer having a third contact hole exposing the drain electrode; and a pixel electrode formed on the passivation layer, the pixel electrode electrically connected to the drain electrode through the third contact hole.

A storage electrode line between the gate insulating layer and the passivation layer, the storage electrode line intersecting the data line, and including a storage electrode may be further included, wherein the storage electrode may be formed along the data line and covering the data line, and the pixel electrode may overlap at least a portion of the storage electrode.

The pixel electrode may overlap at least a portion of the data line.

The gate line may have an expansion, the expansion contacting the gate electrode through the first contact hole, and the data line may also include an expansion, the expansion contacting the source electrodes through the second contact hole.

The expansion of the gate line and the expansion of the data line may be opposite to each other with respect to the channel of the semiconductor.

The pixel electrode may be disposed outside the region where the channel, the source electrode, and the gate electrode are disposed.

The drain electrode may include an extension parallel to the gate line, the extension overlapping the pixel electrode.

Also disclosed is a manufacturing method of a thin film transistor array panel including: forming a gate electrode and a data line on a substrate; forming a gate insulating layer on the data line and the gate electrode; patterning the gate insulating layer to form a first contact hole exposing the gate electrode, and a second contact hole exposing the data line; forming a semiconductor on the gate insulating layer, the semiconductor including a channel; forming a source electrode, the source electrode electrically connected to the data line through the second contact hole, a drain electrode opposite to the source electrode with respect to the channel and a gate line, the gate line electrically connected to the gate electrode through the first contact hole on the gate insulating layer and the semiconductor; forming a passivation layer, the passivation layer having a third contact hole exposing the drain electrode on the gate line, the source electrode, the drain electrode and the channel of the semiconductor; and forming a pixel electrode, the pixel electrode electrically connected to the drain electrode through the third contact hole on the passivation layer.

The forming of the first and second contact holes of the gate insulating layer and the forming of the semiconductor includes depositing a semiconductor layer on the gate insulating layer, coating a photosensitive film on the semiconductor layer, and patterning the photosensitive film with a half tone mask to form a first photosensitive film pattern exposing the semiconductor layer corresponding to the first contact hole and the second contact hole and comprising a first portion corresponding to the semiconductor and a second portion corresponding to the remaining portion, wherein the second portion has a thickness that is less than that of the first portion, etching the semiconductor layer and the underlying gate insulating layer by using the first photosensitive film pattern as an etch mask to form the first contact hole and the second contact hole, etching the surface of the first photosensitive film pattern to form the second photosensitive film pattern exposing the semiconductor layer under the second portion, and etching to expose semiconductor layer by using the second photosensitive film pattern as an etch mask.

A storage electrode line, including a storage electrode, is formed along the data line and covers the data line, wherein the storage electrode line may be further formed in the forming of the source electrode, the drain electrode, and the gate line.

Etching the upper portion of the semiconductor exposed between the source electrode and the drain electrode between the forming of the source electrode, the drain electrode, and the gate line, and the forming of the passivation layer may be further included.

According to an exemplary embodiment, the storage electrode line is disposed on the data line such that the affection of the voltage of the data line may be reduced for the pixel electrode.

Also, the data line and the source electrode, and the gate line and the gate electrode are directly connected to each other through the contact hole, thereby reducing the area for the connection thereof.

Also, the contact holes for the connection between the data line and the source electrode, and the gate line and the gate electrode are formed when patterning the semiconductor layer such that increasing of the number of photolithography processes may be prevented.

These and other features, aspects, and advantages of the disclosed embodiments will become better understood with reference to the following description and appended claims.

BRIEF DESCRIPTION OF THE DRAWINGS

The disclosed subject matter is particularly pointed out and distinctly claimed in the claims at the conclusion of the specification. The foregoing and other aspects, features, and advantages of the disclosed embodiments are apparent from the following detailed description taken in conjunction with the accompanying drawings in which:

Figure 1:
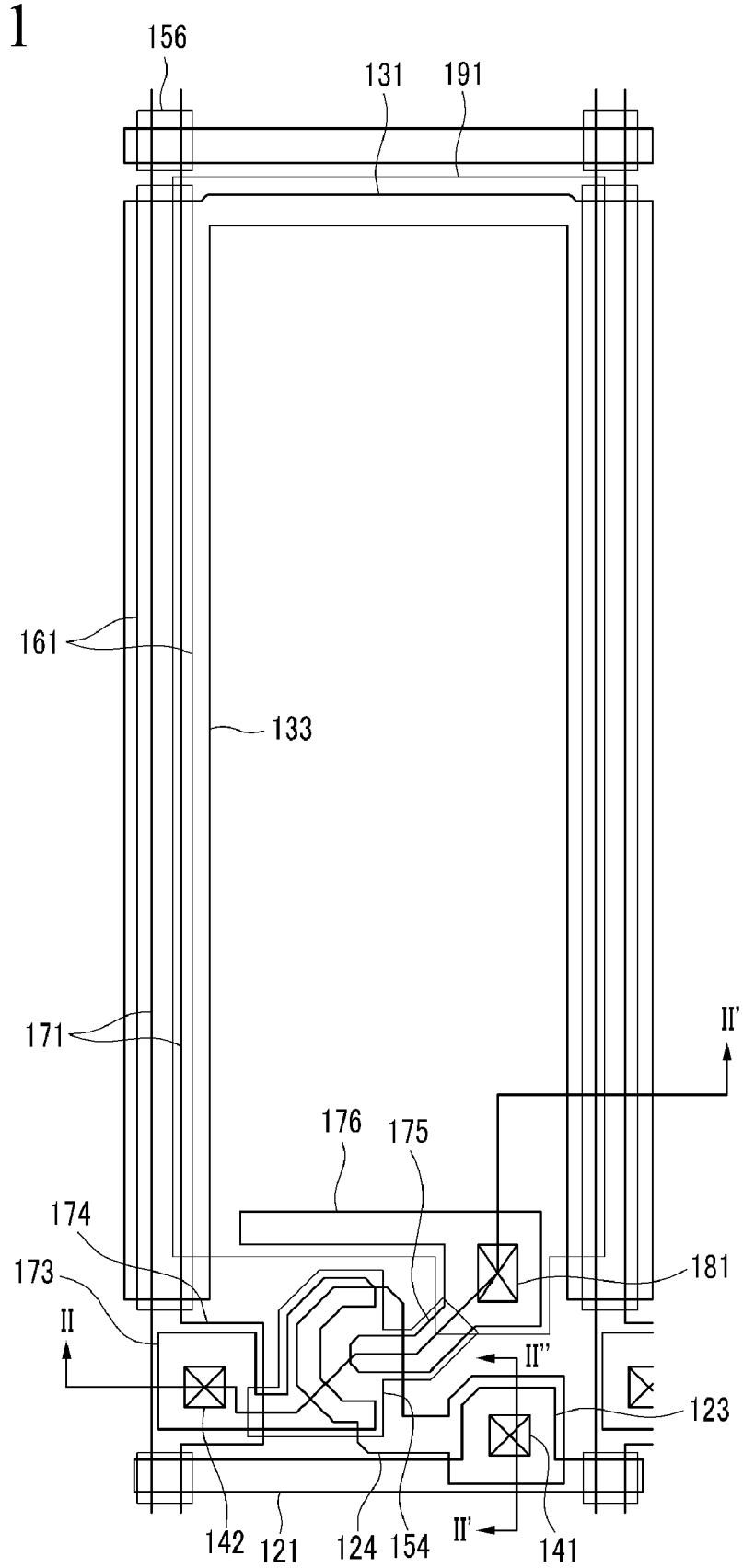
FIG. 1 is a plan view showing an exemplary embodiment of a thin film transistor array panel.

The detailed description explains the exemplary embodiments, together with advantages, aspects, and features, by way of example with reference to the drawings.

DETAILED DESCRIPTION OF THE INVENTION

The disclosed embodiments will be described more fully hereinafter with reference to the accompanying drawings, in which exemplary embodiments are shown. As those skilled in the art would realize, the described embodiments may be modified in various different ways, all without departing from the spirit or scope of the disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a thin film transistor array panel according to an exemplary embodiment will be described in detail with the reference to FIGS. 1 to 3.

Exemplary Embodiment 1

Figure 2:
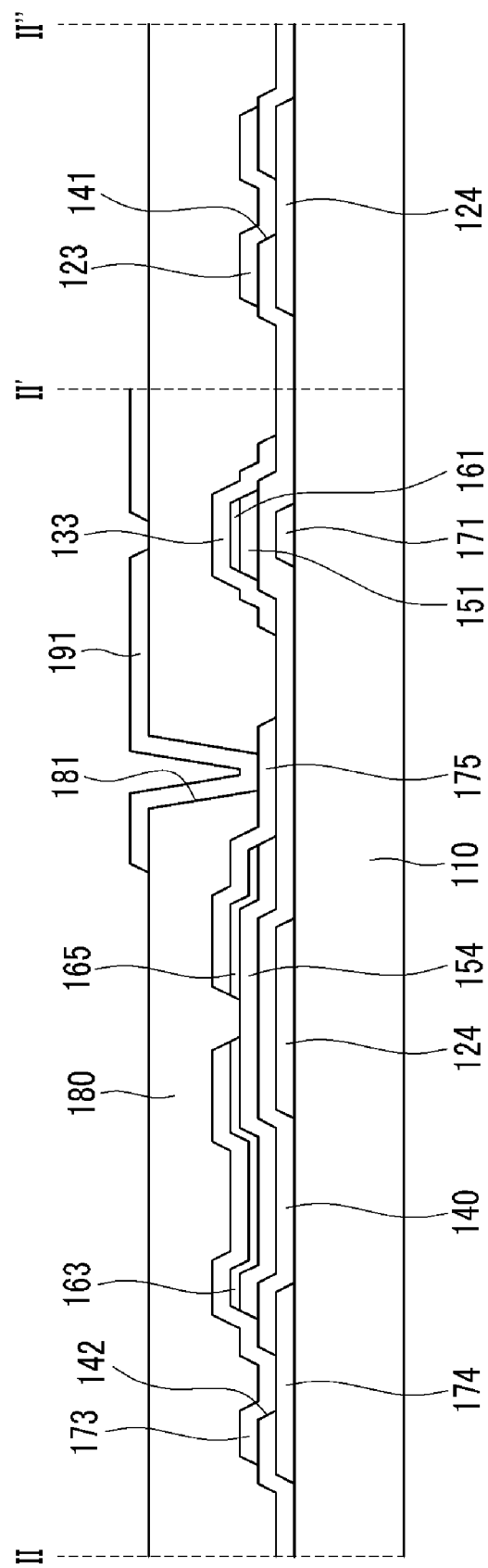
FIG. 2 is a cross-sectional view showing an exemplary embodiment of the thin film transistor array panel shown in FIG. 1 taken along lines II-II' and II'-II"
Figure 3:
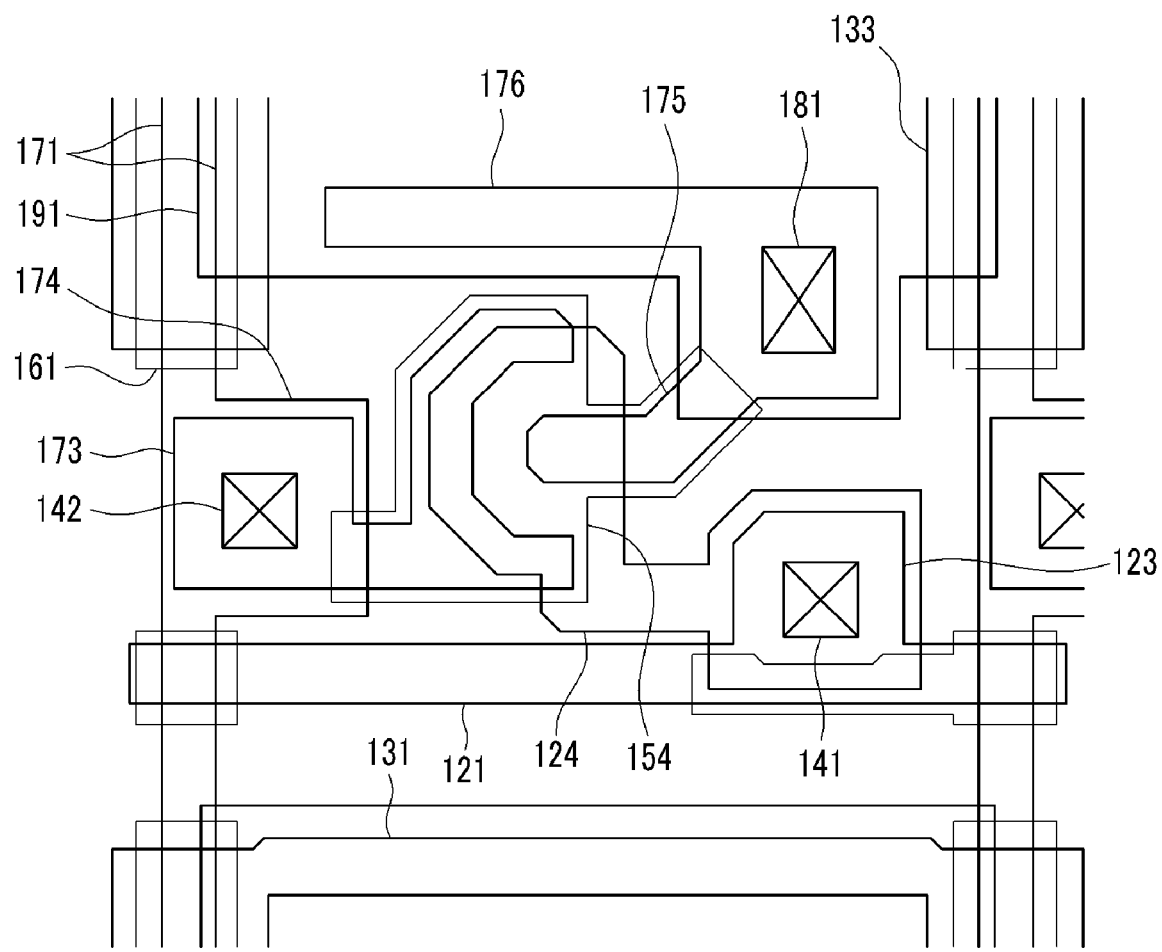
FIG. 3 is an enlarged view showing an exemplary embodiment of a thin film transistor part in the thin film transistor array panel shown in FIG. 1.

FIG. 1 is a plan view of an exemplary embodiment of a thin film transistor array panel, FIG. 2 is a cross-sectional view of the thin film transistor array panel shown in FIG. 1 taken along lines II-II' and II'-II", and FIG. 3 is an enlarged view of the thin film transistor in the thin film transistor array panel shown in FIG. 1.

A gate electrode 124 having an island shape and a data line 171 extending in a longitudinal direction are disposed on an insulating substrate 110, such as transparent glass. The data line 171 includes a plurality of expansions 174. The data line 171 transmits image signal voltages. The gate electrode 124 is disposed under a channel of the thin film transistor and includes a portion for applying the voltage and a portion for electrical connection to a gate line 121.

A gate insulating layer 140 is disposed on the gate electrode 124 and the data line 171. The gate insulating layer 140 has a contact hole 141 exposing the gate electrode 124 and a contact hole 142 exposing the expansion 174 of the data line 171.

Intrinsic semiconductors 151, 154, and 156, which can comprise amorphous silicon, are disposed on the gate insulating layer 140. The intrinsic semiconductors 151, 154, and 156 are disposed along the data line 171, and include a data line portion 151, which covers the data line 171 with a wider area than the data line 171, a crossing portion 156, separated from the data line portion 151 and disposed on the portion where the data line 171 and the gate line 121 cross each other, and a thin film transistor portion 154, the thin film transistor portion 154 overlapping the gate electrode 124 and forming the thin film transistor.

Ohmic contacts 161, 163, and 165 can comprise n+ hydrogenated amorphous silicon, into which an n-type impurity is doped at a high concentration, or a silicide. The ohmic contacts are formed on the intrinsic semiconductors 151, 154, and 156. The ohmic contacts 161, 163, and 165 include an ohmic contact data line portion 161, disposed on the intrinsic semiconductor data line portion 151, and source and drain portions 163 and 165, separated from each other on the thin film transistor portion 154. The ohmic contacts 161, 163, and 165 may include a portion (not shown) disposed on the intrinsic semiconductor crossing portion 156.

For convenience, the intrinsic semiconductors 151, 154, and 156, and the ohmic contacts 161, 163, and 165, may be referred to as a semiconductor, and the semiconductor may comprise a polysilicon semiconductor, an oxide semiconductor, or the like, or a combination comprising at least one of the foregoing semiconductors.

A source electrode 173, a drain electrode 175, a gate line 121, and a storage electrode line 131 are disposed on the gate insulating layer 140 and the ohmic contacts 161, 163, and 165. The source electrode 173 is electrically connected to the expansion 174 of the data line 171 through the contact hole 142, and is opposite to the drain electrode 175 on the intrinsic semiconductor 154. The drain electrode 175 includes a facing portion which opposes the source electrode 173, an extension portion extending parallel to two adjacent gate lines 121, and an expansion portion electrically connected the facing portion and the extension portion. The gate line 121 extends in a transverse direction, and includes a plurality of expansions 123, and the expansion 123 is electrically connected to the gate electrode 124 through the contact hole 141. The gate line 121 transmits scanning signals. The storage electrode line 131 extends in the transverse direction, and includes a storage electrode 133. The storage electrode 133 extends along the data line 171, and has a wider width than that of the ohmic contact layer data line portion 161, such that the ohmic contact layer data line portion 161 is disposed within the width of the storage electrode 133. The storage electrode line 131 is applied with a predetermined fixed voltage such as a common voltage.

The gate electrode 124, the source electrode 173, and the drain electrode 175 form a thin film transistor (TFT) along with the intrinsic semiconductor 154 and the ohmic contacts 163 and 165, and the channel of the thin film transistor is disposed on the intrinsic semiconductor 154 between the source electrode 173 and the drain electrode 175.

A passivation layer 180 is disposed on the gate insulating layer 140, the gate line 121, the storage electrode line 131, the source electrode 173, the drain electrode 175, and the channel of the intrinsic semiconductor 154. The passivation layer 180 may comprise an inorganic insulating material, such as silicon nitride, or silicon oxide, or an organic insulating material, such as a resin, or the like, or a combination comprising at least one of the foregoing insulating materials. The passivation layer 180 has a contact hole 181 that exposes the expansion portion of the drain electrode 175.

A pixel electrode 191 may comprises a transparent conductive material or a conductive material having good reflection characteristics, such as ITO, IZO, silver, aluminum, or the like, or a combination comprising at least one of the foregoing conductive materials. The pixel electrode is disposed on the passivation layer 180. The pixel electrode 191 is electrically connected to the expansion portion of the drain electrode 175 through the contact hole 181. The pixel electrode 191 receives the data voltage from the drain electrode 175. The pixel electrode 191 overlaps the storage electrode 133 and the extension portion 176 of the drain electrode, and is disposed outside of the region where the source electrode 173, the intrinsic semiconductor thin film transistor portion 154, and the gate electrode 124 are disposed. The pixel electrode 191 may partially overlap the data line 171. Overlapping of the pixel electrode 191 and the data line 171 is possible because the storage electrode 133 applied with the common voltage is disposed between the data line 171 and the pixel electrode 191 such that the voltage of the data line 171 does not affect the pixel electrode 191.

Although not shown, contact assistants covering the end portions of the gate line 121 and the data line 171 may be disposed with the same material as the pixel electrode 191 on the passivation layer 180. The contact assistants complement adhesion of the end portion of the gate line 121 and the end portion of the data line 171 with an external device such as a driver IC, and protect them.

As above described, the storage electrode line 131 is disposed between the data line 171 and the pixel electrode 191 such that the influence of the voltage of the data line on the pixel electrode 191 may be reduced, and though the overlapping area between the pixel electrode 191 and the storage electrode 133 is small, the storage capacitance may be sufficient such that the width of the storage electrode 133 may be reduced, thereby improving the aperture ratio.

Also, the data line 171 and the source electrode 173, and the gate line 121 and the gate electrode 124 are respectively and directly connected to each other through the contact holes 141 and 142 of the gate insulating layer 140 such that the area of the opaque region for the connection thereof may be reduced. That is, the expansion 123 of the gate line 121 for connection to the gate electrode 124, and the expansion 174 of the data line 171 for connection to the source electrode 173 may be disposed in the right side and the left side with respect to the channel of the intrinsic semiconductor 154, and the contact holes 141, 142, and 181, and the thin film transistor are disposed thereon such that the area that does not contribute to the aperture ratio may be minimized. Accordingly, the aperture ratio may be improved.

Also, the data line 171 and the source electrode 173, and the gate line 121 and the gate electrode 124 are directly connected to each other without a connecting member, such as ITO, such that their contact resistance may be reduced.

Next, a method for manufacturing this thin film transistor array panel will be described.

Figure 4:
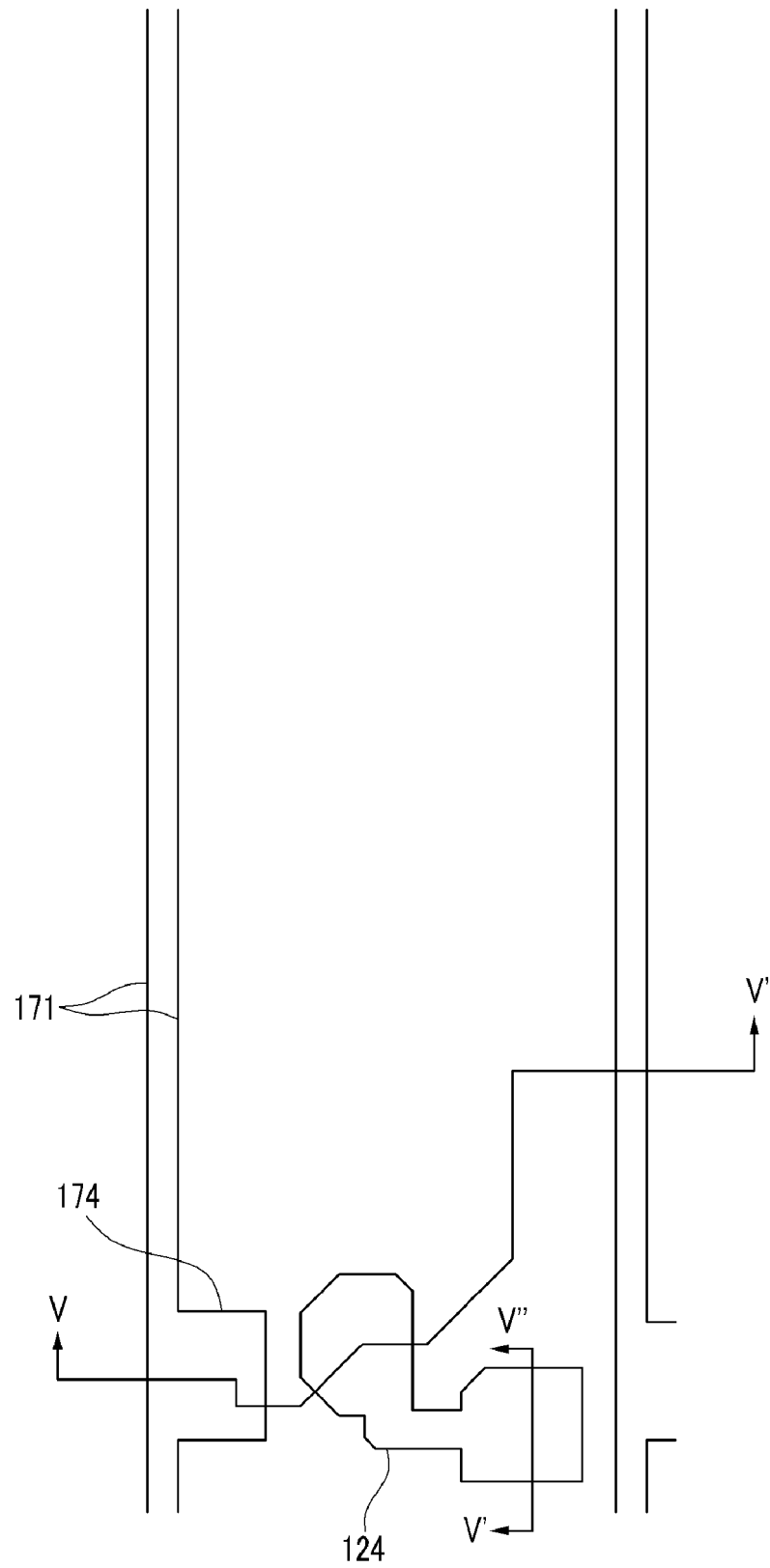
FIG. 4, FIG. 6, FIG. 8, FIG. 10, and FIG. 12 are plan views showing intermediate steps of an exemplary embodiment of a manufacturing process of the thin film transistor array panel.
Figure 5:
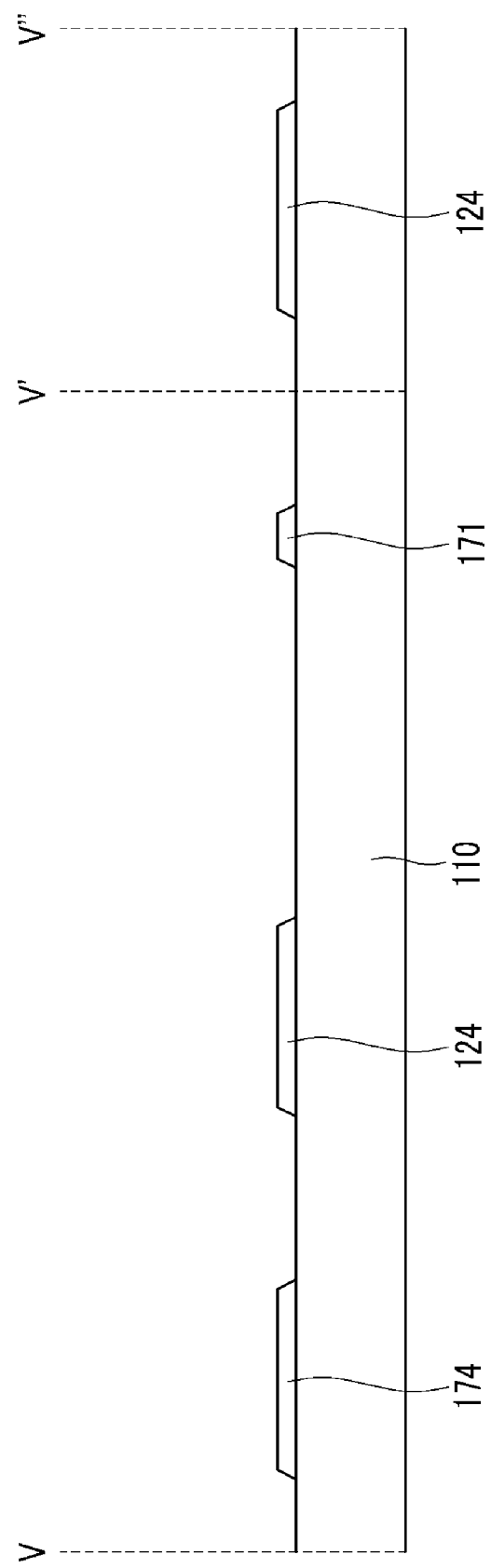
FIG. 5 is a cross-sectional view showing an exemplary embodiment taken along lines V-V' and V'-V" of FIG. 4.
Figure 6:
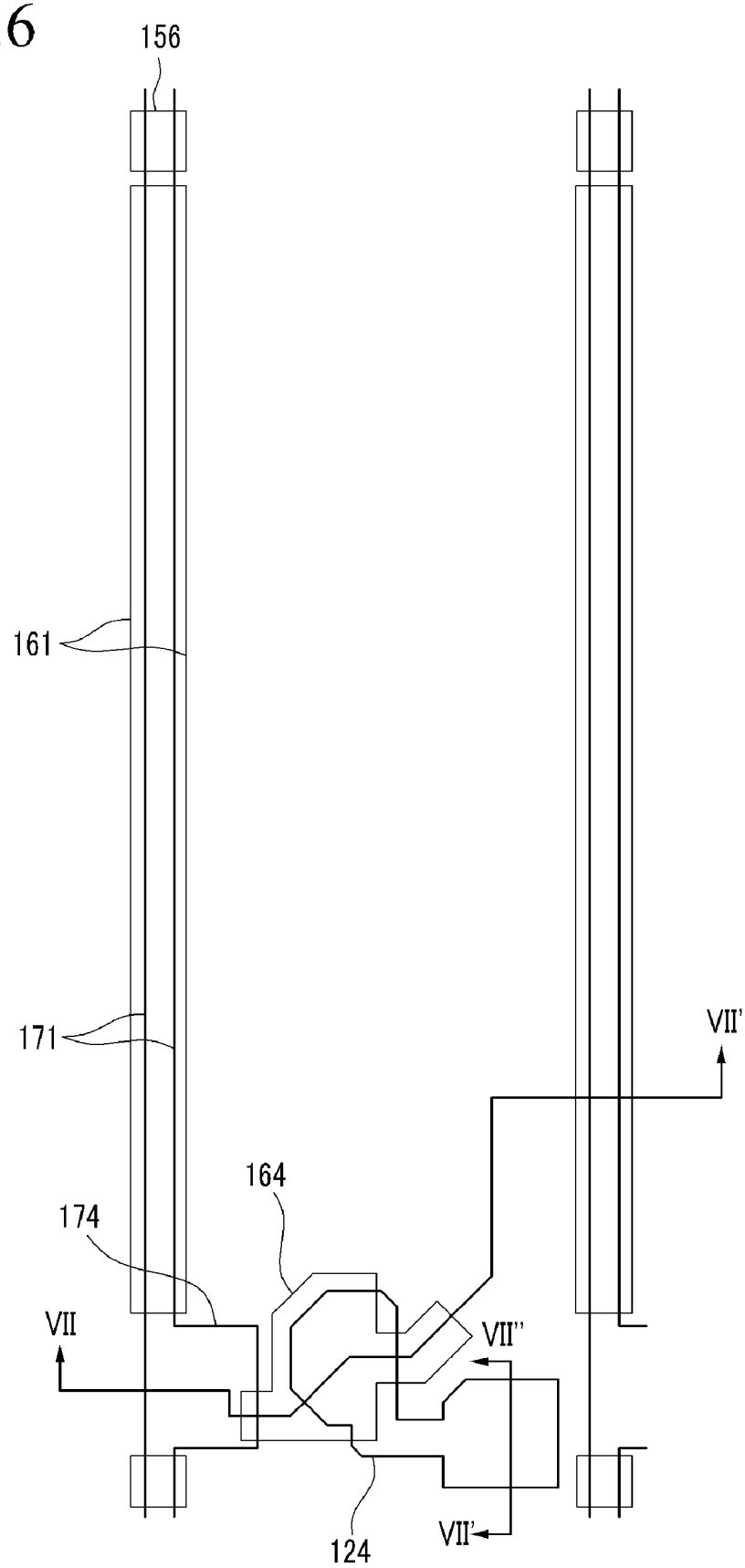
Figure 7:
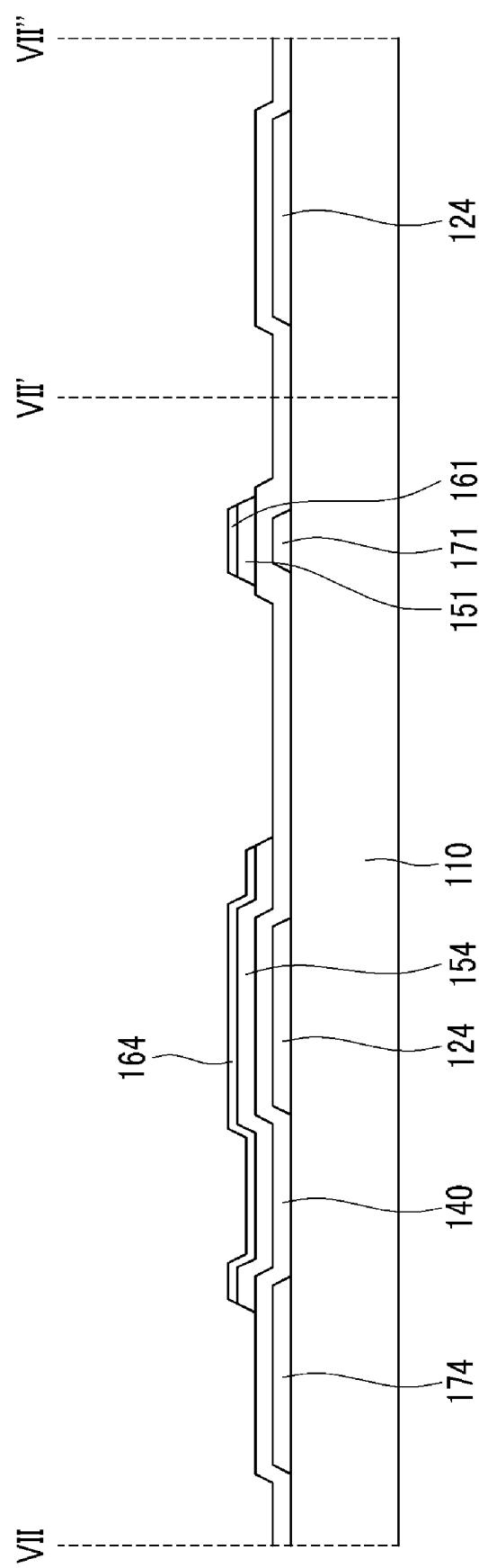
FIG. 7 is a cross-sectional view showing an exemplary embodiment taken along lines VII-VII' and VII'-VII" of FIG. 6.
Figure 8:
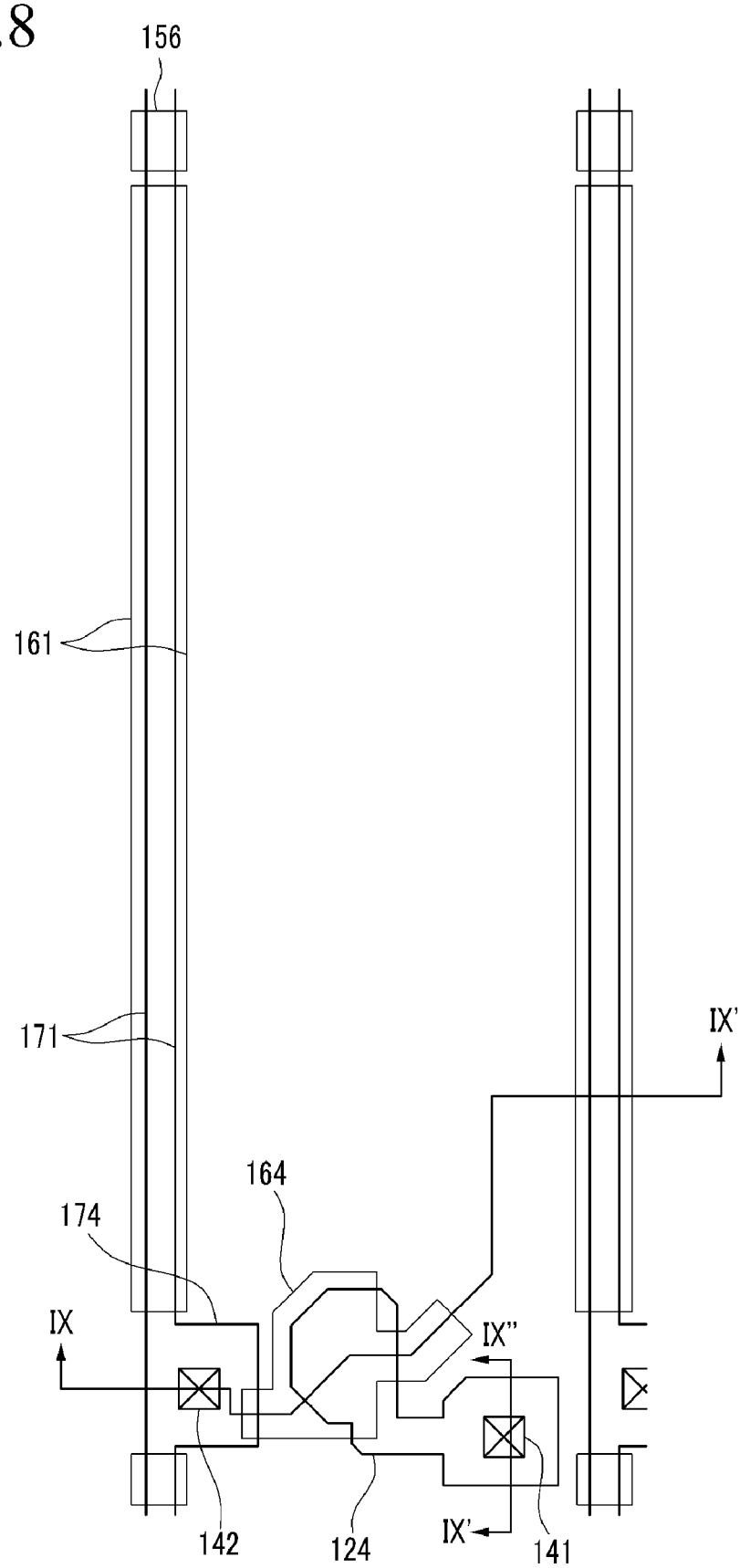
Figure 9:
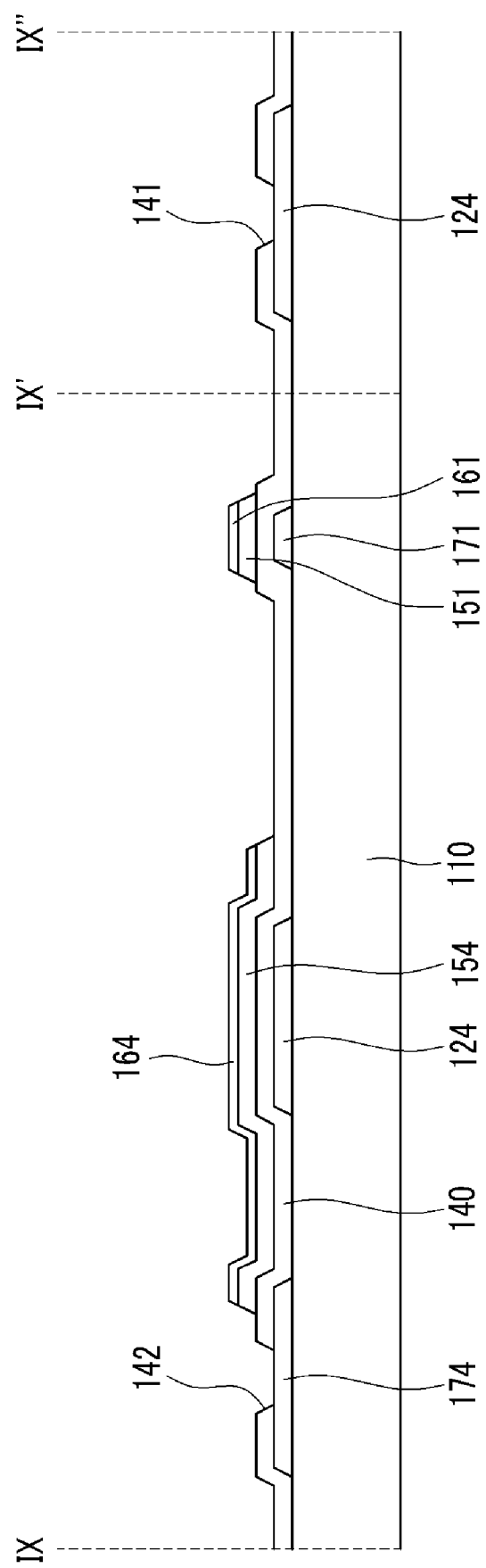
FIG. 9 is a cross-sectional view showing an exemplary embodiment taken along lines IX-IX' and IX'-IX" of FIG. 8.
Figure 10:
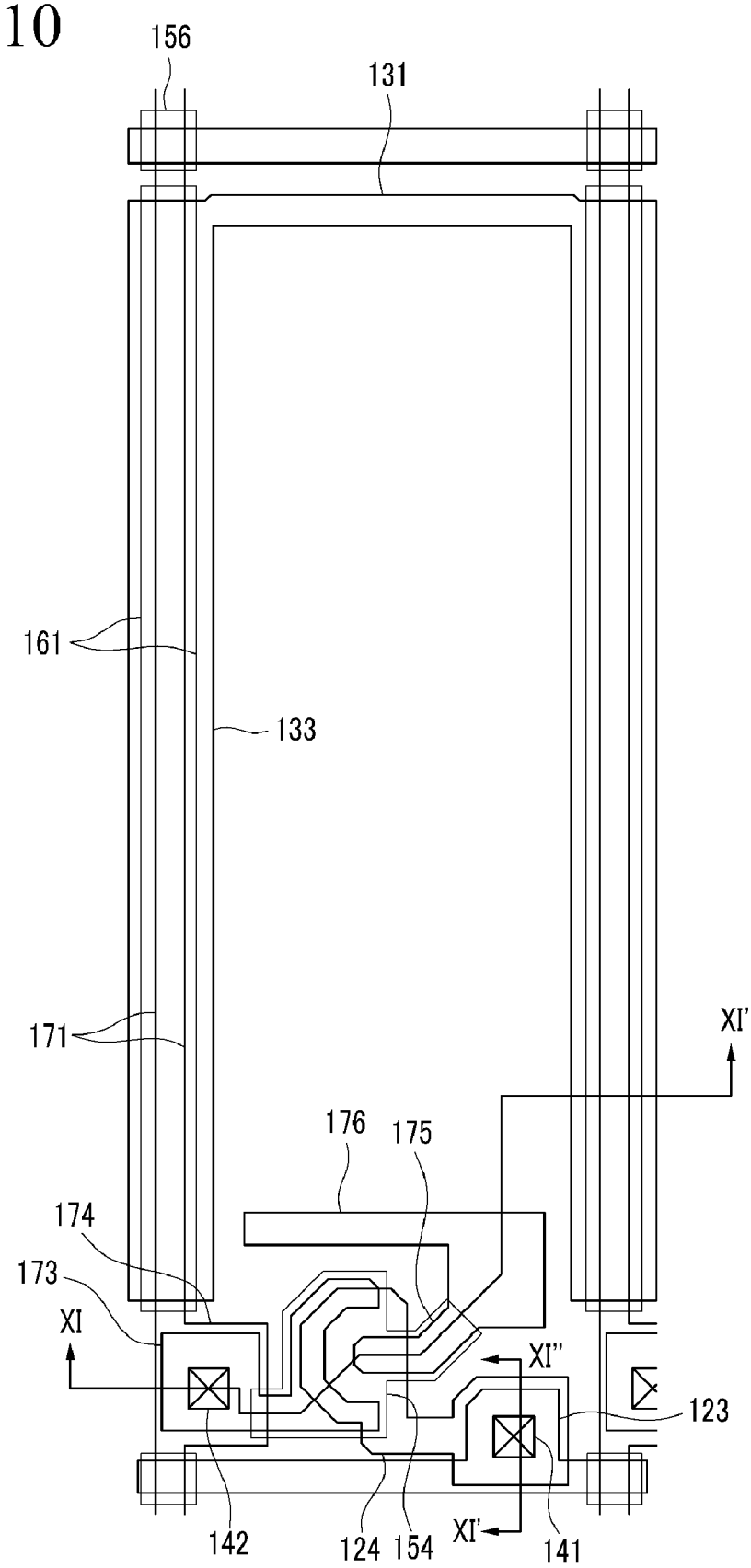
Figure 11:
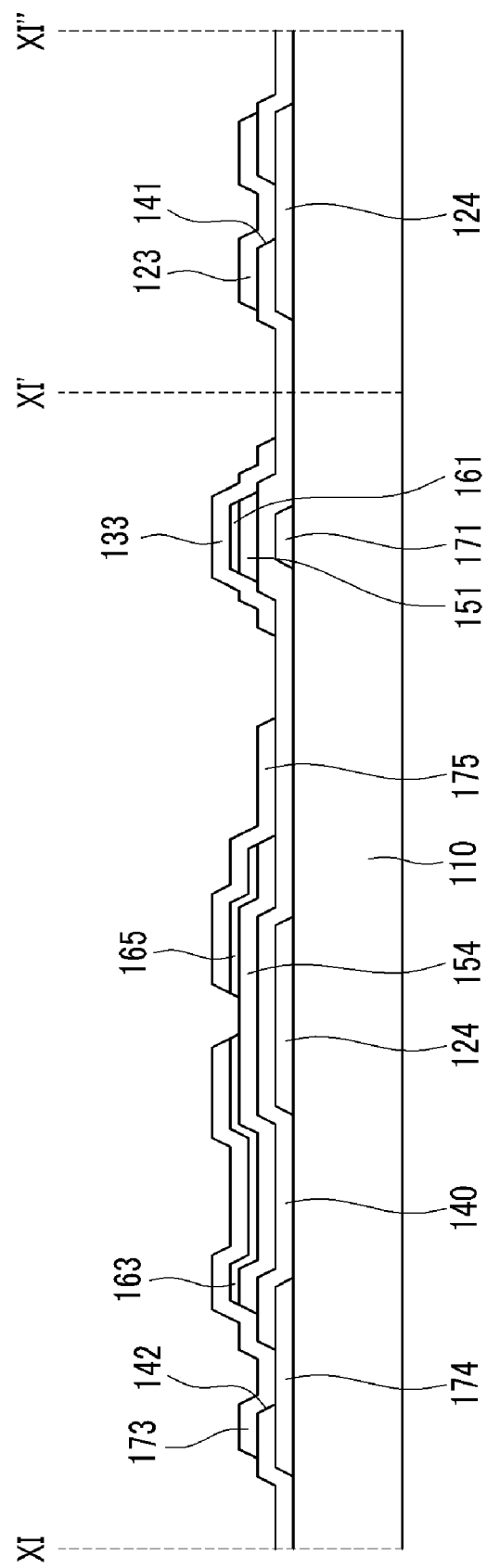
FIG. 11 is a cross-sectional view showing an exemplary embodiment taken along lines XI-XI' and XI'-XI" of FIG. 10.
Figure 12:
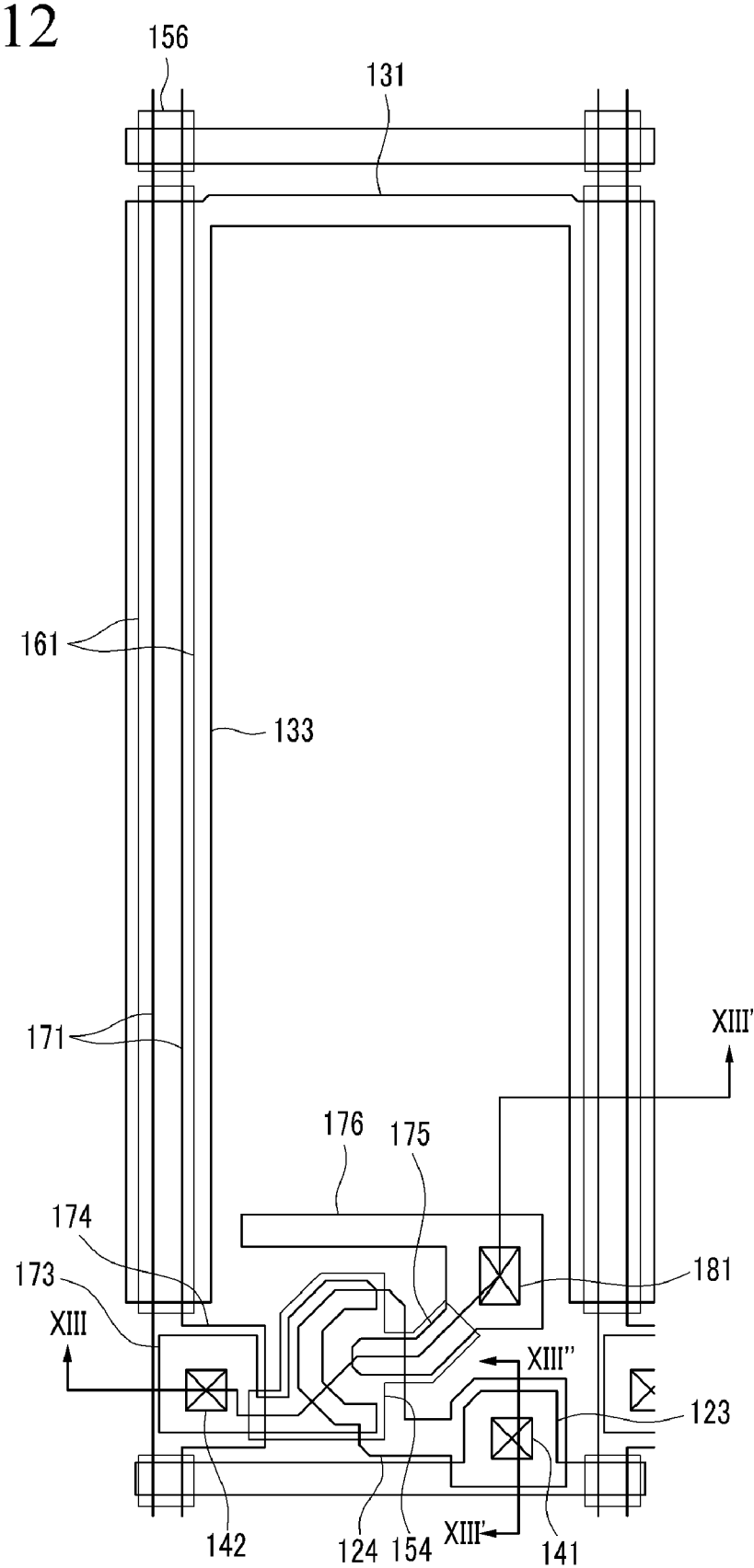
Figure 13:
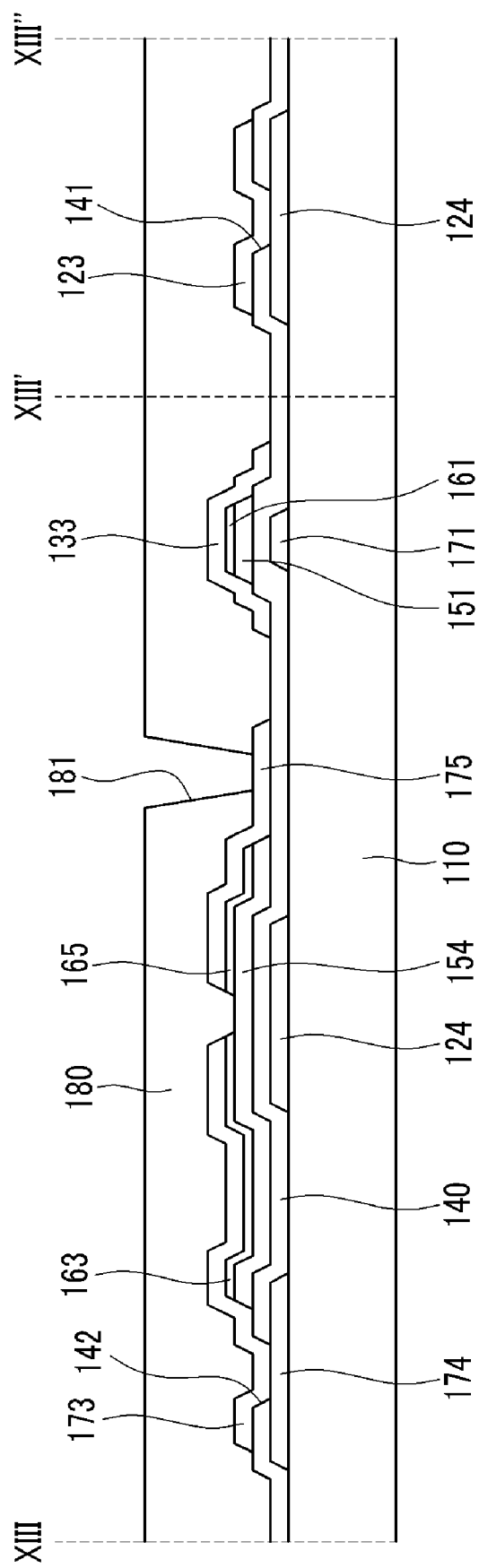
FIG. 13 is a cross-sectional view showing an exemplary embodiment taken along lines XII-XII' and XII'-XII" of FIG. 12.

FIG. 4, FIG. 6, FIG. 8, FIG. 10, and FIG. 12 are plan views showing intermediate steps of an exemplary embodiment of a manufacturing process of the thin film transistor array panel, FIG. 5 is a cross-sectional view taken along lines V-V' and V'-V" of FIG. 4, FIG. 7 is a cross-sectional view taken along lines VII-VII' and VII'-VII" of FIG. 6, FIG. 9 is a cross-sectional view taken along lines IX-IX' and IX'-IX" of FIG. 8, FIG. 11 is a cross-sectional view taken along lines XI-XI' and XI'-XI" of FIG. 10, and FIG. 13 is a cross-sectional view taken along lines XII-XII' and XII'-XII" of FIG. 12.

Firstly, referring to FIG. 4 and FIG. 5, a data line 171, including a plurality of expansions 174, and a gate electrode 124, are formed on an insulating substrate 110 using photolithography.

Next, referring to FIG. 6 and FIG. 7, a gate insulating layer 140, an intrinsic semiconductor layer, and an ohmic contact layer are deposited on the data line 171, and the gate electrode 124, and the intrinsic semiconductor layer and the ohmic contact layer are patterned by photolithography to form incomplete ohmic contacts 161 and 164 and intrinsic semiconductors 151, 154, and 156.

Referring to FIG. 8 and FIG. 9, the gate insulating layer 140 is patterned by photolithography to form a contact hole 141 exposing the gate electrode 124 and a contact hole 142 exposing the expansion 174 of the data line 171.

Referring to FIG. 10 and FIG. 11, a metal layer is disposed on the gate insulating layer 140 and the incomplete ohmic contacts 161 and 164, and patterned by photolithography to form a gate line 121 electrically connected to the gate electrode 124 through the contact hole 141, a source electrode 173 connected to the expansion 174 of the data line 171 through the contact hole 142, a drain electrode 175, and a storage electrode line 131. Next, the incomplete ohmic contacts 161 and 164 are etched to complete ohmic contacts 161, 163, and 165.

Next, referring to FIG. 12 and FIG. 13, a passivation layer 180 is disposed on the gate insulating layer 140, the gate line 121, the storage electrode line 131, the source electrode 173, the drain electrode 175, and the channel of the intrinsic semiconductor 154, and patterned by photolithography to form a contact hole 181 exposing the drain electrode 175.

Next, referring to FIG. 1 and FIG. 2, a transparent conductive layer or a reflection metal layer is disposed on the passivation layer 180 and patterned by photolithography to form a pixel electrode 191.

Exemplary Embodiment 2

Figure 14:
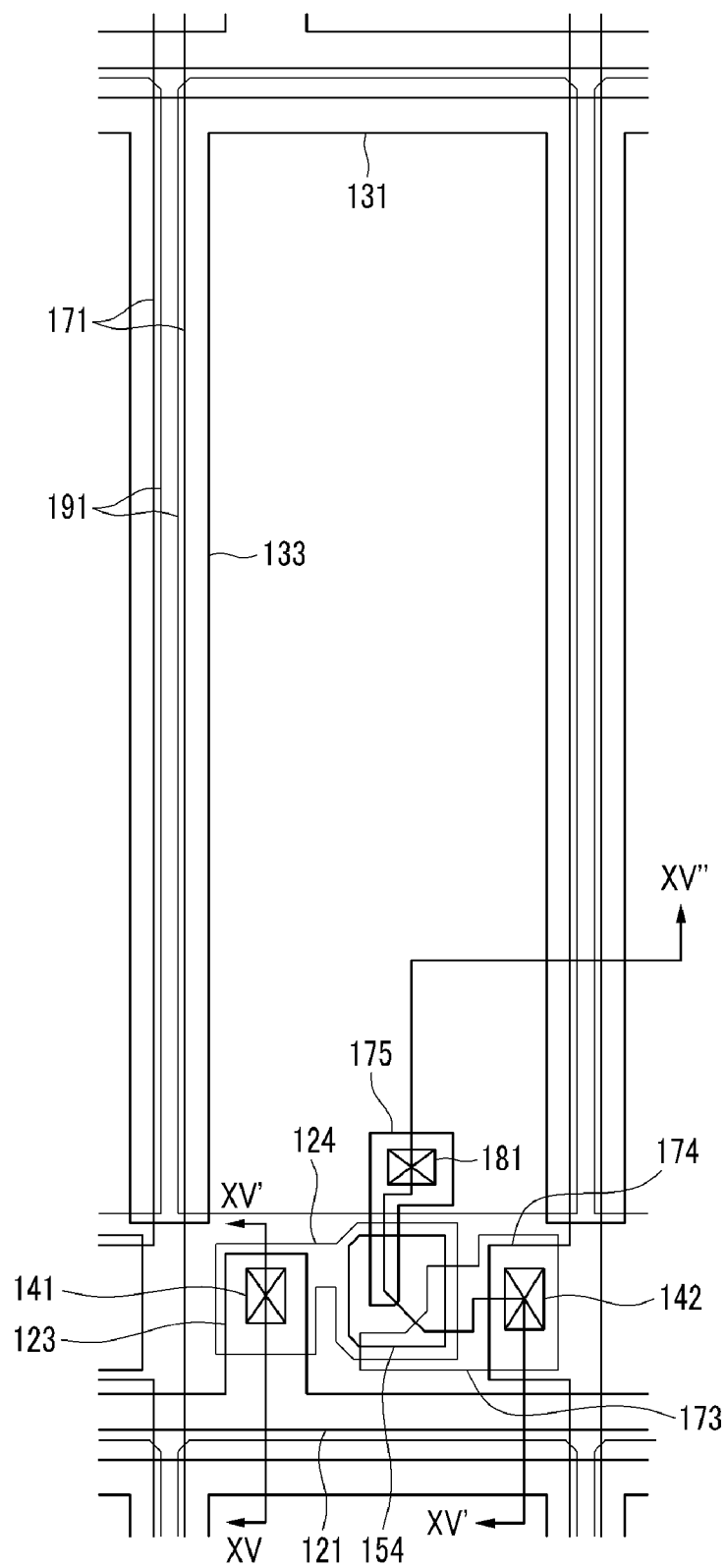
FIG. 14 is a plan view showing another exemplary embodiment of a thin film transistor array panel.
Figure 15:
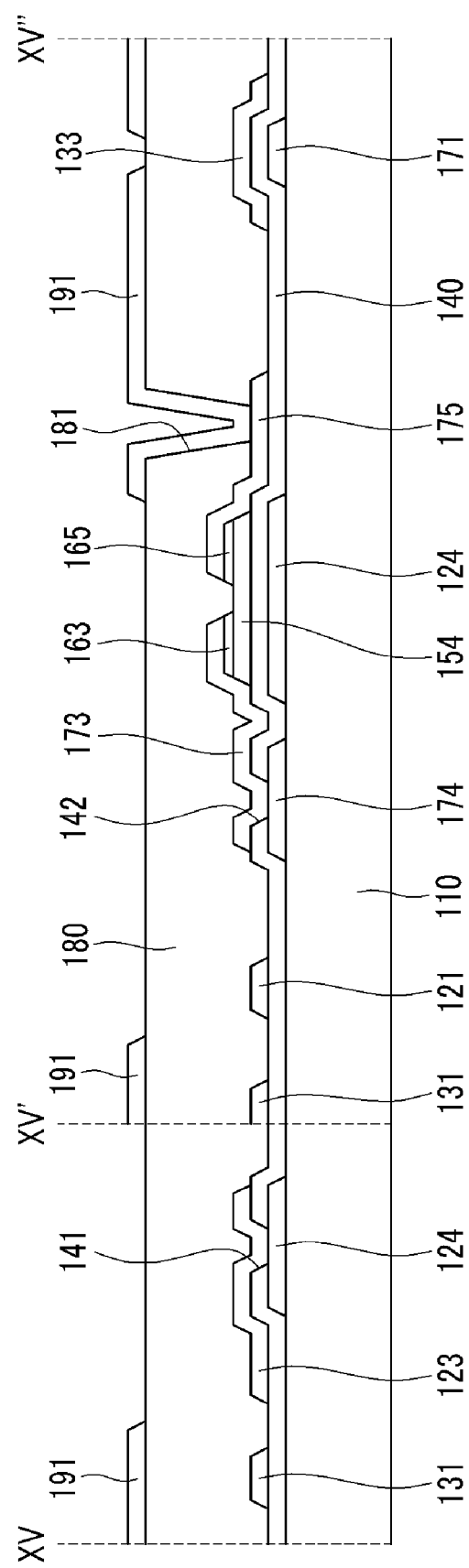
FIG. 15 is a cross-sectional view showing an exemplary embodiment taken along lines XV-XV' and XV'-XV" of FIG. 14.

FIG. 14 is a plan view of an exemplary embodiment of a thin film transistor array panel, and FIG. 15 is a cross-sectional view along lines XV-XV' and XV'-XV" of FIG. 14.

The layered structure of the thin film transistor array panel shown in FIG. 14 and FIG. 15 is the same as that of the thin film transistor array panel shown in FIG. 1 and FIG. 2.

That is, a gate electrode 124 having an island shape and a data line 171 extending in a longitudinal direction are disposed on an insulating substrate 110 such as transparent glass. The data line 171 includes a plurality of expansions 174. A gate insulating layer 140 is formed on the gate electrode 124 and the data line 171.

The gate insulating layer 140 has a contact hole 141 exposing the gate electrode 124 and a contact hole 142 exposing the expansion 174 of the data line 171.

An intrinsic semiconductor 154, which may comprise amorphous silicon, is formed on the gate insulating layer 140.

Ohmic contacts 163 and 165, which may comprise n+ hydrogenated amorphous silicon into which an n-type impurity is doped at a high concentration, or a silicide, are disposed on the intrinsic semiconductor 154.

A source electrode 173, a drain electrode 175, a gate line 121, and a storage electrode line 131 are disposed on the gate insulating layer 140, and the ohmic contacts 163 and 165. The source electrode 173 is connected to the expansion 174 of the data line 171 through the contact hole 142, and is opposite to the drain electrode 175 on the intrinsic semiconductor 154. The gate line 121 extends in the transverse direction, and includes a plurality of expansions 123, and the expansions 123 are electrically connected to the gate electrode 124 through the contact hole 141. The storage electrode line 131 extends in the transverse direction, and includes a storage electrode 133. The storage electrode 133 extends along the data line 171, and has a wider width than that of the data line 171 such that the data line 171 is disposed within the width of the storage electrode 133. The storage electrode line 131 is applied with a predetermined fixed voltage such as a common voltage.

The gate electrode 124, the source electrode 173, and the drain electrode 175 form a thin film transistor (TFT) along with the intrinsic semiconductor 154 and the ohmic contact 163 and 165, and the channel of the thin film transistor is disposed on the intrinsic semiconductor 154 between the source electrode 173 and the drain electrode 175.

A passivation layer 180 is disposed on the gate insulating layer 140, the gate line 121, the storage electrode line 131, the source electrode 173, the drain electrode 175, and the channel of the intrinsic semiconductor 154. The passivation layer 180 may comprise an inorganic insulating material, such as silicon nitride, or silicon oxide, or an organic insulating material, such as resin, or the like, or a combination comprising at least one of the foregoing insulating materials. The passivation layer 180 has a contact hole 181 exposing the expansion portion of the drain electrode 175.

A pixel electrode 191, which may comprise a transparent conductive material, such as ITO or IZO, or a conductive material having good reflection characteristics, such as silver or aluminum, or the like, or a combination comprising at least one of the foregoing conductive materials, is disposed on the passivation layer 180. The pixel electrode 191 is electrically connected to the expansion portion of the drain electrode 175 through the contact hole 181. The pixel electrode 191 receives the data voltage from the drain electrode 175. The pixel electrode 191 overlaps the storage electrode 133 and the extension portion 176 of the drain electrode, and is disposed outside of the region where the source electrode 173, the intrinsic semiconductor thin film transistor portion 154, and the gate electrode 124 are disposed. The pixel electrode 191 may partially overlap the data line 171.

The difference between the thin film transistor array panel shown in FIG. 14 and FIG. 15 and the thin film transistor array panel shown in FIG. 1 and FIG. 2 is includes the shape of the intrinsic semiconductor 154, the ohmic contacts 163 and 165, the expansions 174 of the data line 171, the expansions 123 of the gate line 121, the gate electrode 124, the source electrode 173, and the drain electrode 175. In particular, the expansions 174 of the data line, the expansions 123 of the gate line 121, the gate electrode 124, and the source electrode 173 are disposed on the left side and the right side with respect to the intrinsic semiconductor 154, and the drain electrode 175 extends upward from the intrinsic semiconductor 154 to connect to the pixel electrode 191, which is different from the thin film transistor array panel shown in FIG. 1 and FIG. 2. In this arrangement, the thin film transistor and the contact holes 141, 142, and 181 are disposed such that the area that does not contribute to the aperture ratio may be reduced, thereby improving the aperture ratio.

The manufacturing method of the second exemplary embodiment includes differences compared with the first exemplary embodiment.

Figure 16:
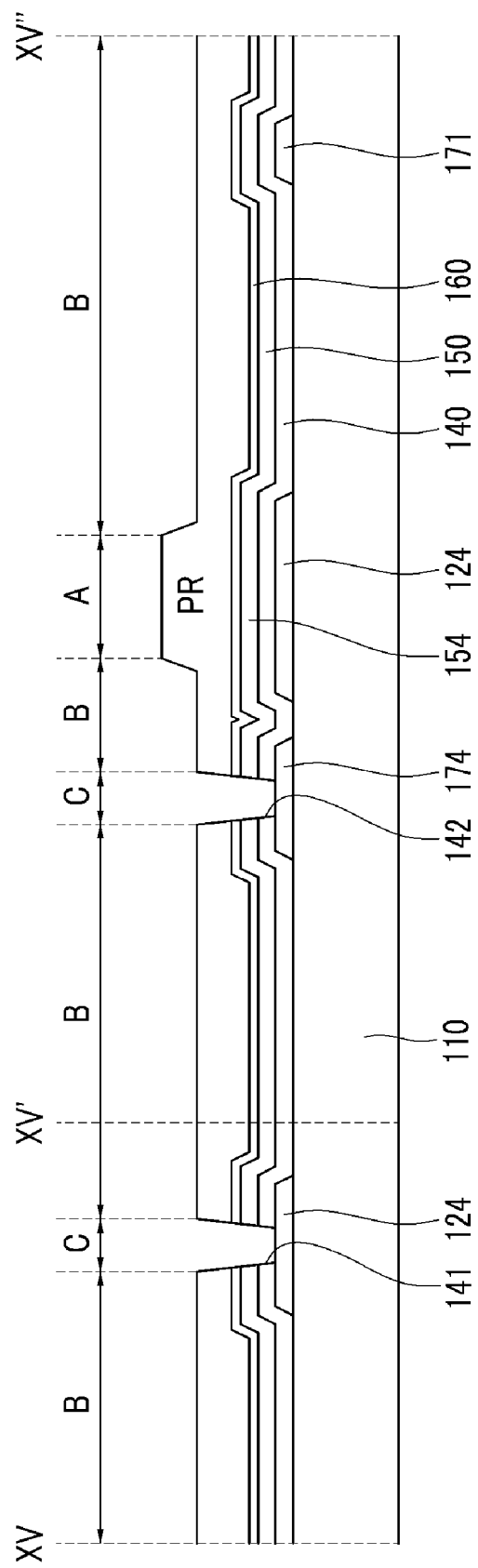
FIG. 16 and FIG. 17 are cross-sectional views showing intermediate steps of an exemplary embodiment of a manufacturing process of a thin film transistor array panel.
Figure 17:
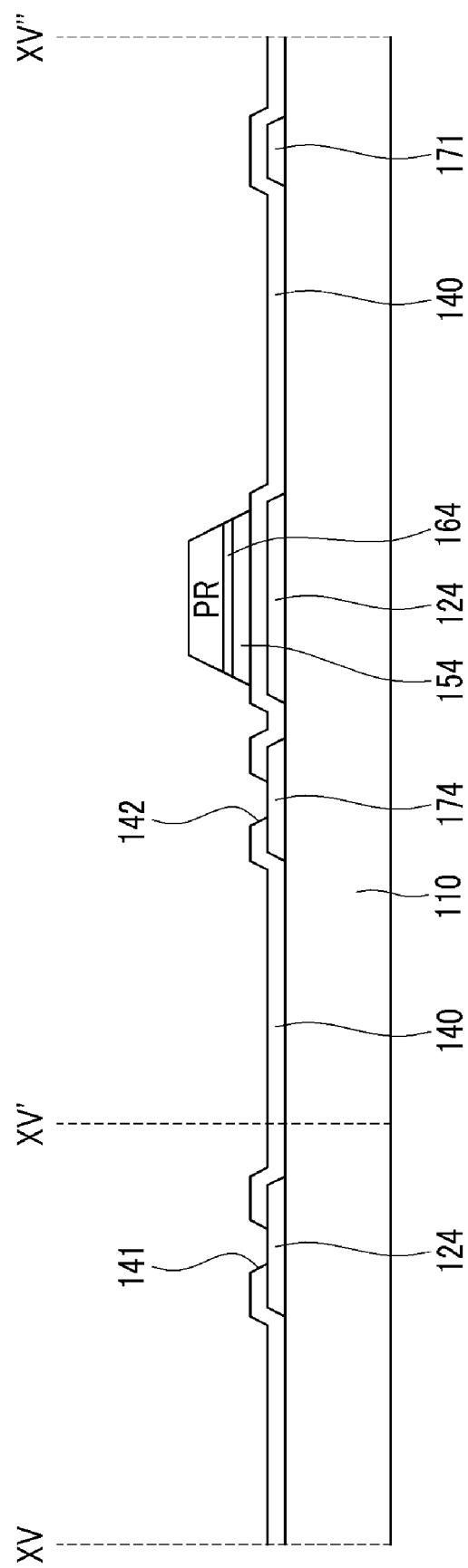

FIG. 16 and FIG. 17 are cross-sectional views showing intermediate steps of an exemplary embodiment of a manufacturing process of the thin film transistor array panel.

Firstly, referring to FIG. 16, a data line 171, including expansions 174, and a gate electrode 124 are disposed on an insulating substrate 110 by a photolithography process, a gate insulating layer 140, an intrinsic semiconductor layer 150, and an ohmic contact layer 160 are disposed on the data line 171 and the gate electrode 124, and a photosensitive film is coated on the intrinsic semiconductor layer 150 and the ohmic contact layer 160. Next, the photosensitive film is exposed and developed by using a half tone mask using a slit or a translucent layer to form a photosensitive film pattern ("PR") having different thicknesses depending on the position. The photosensitive film pattern PR includes a portion A, corresponding to an intrinsic semiconductor 154, and an incomplete ohmic contact 164, having a first thickness, which exposes the ohmic contact layer 160 in a portion C where contact holes 141 and 142 will be formed, and has a remaining portion B having a second thickness which is thinner than the first thickness. Next, the ohmic contact layer 160, the intrinsic semiconductor layer 150, and the gate insulating layer 140 are etched by using the photosensitive film pattern PR as a mask to form contact holes 141 and 142 exposing the gate electrode 124 and the expansions 174 of the data line 171.

Next, referring to FIG. 17, the photosensitive film pattern PR is patterned with the whole surface etch to reduce the thickness such that the photosensitive film of the thin portion B is removed, and then the ohmic contact layer 160 and the intrinsic semiconductor layer 150 are etched by using the remained photosensitive film pattern PR as a mask.

By using this method, the formation of the intrinsic semiconductor 154 and the incomplete ohmic contact 164, and the formation of the contact holes 141 and 142 may be formed through one photolithography process.

Next, referring to FIG. 15, a metal layer is disposed on the gate insulating layer 140 and the incomplete ohmic contact 164, and patterned by photolithography to form a gate line 121 connected to the gate electrode 124 through the contact hole 141, a source electrode 173 electrically connected to the expansion 174 of the data line 171 through the contact hole 142, a drain electrode 175, and a storage electrode line 131. Next, the exposed incomplete ohmic contact 164 is etched to form ohmic contacts 163 and 165. A passivation layer 180 is disposed on the gate insulating layer 140, the gate line 121, the storage electrode line 131, the source electrode 173, the drain electrode 175, and the channel of the intrinsic semiconductor 154, and patterned by photolithography to form a contact hole 181, exposing the drain electrode 175. Next, a transparent conductive layer, or a metal layer with excellent reflective properties, is disposed on the passivation layer 180, and patterned by photolithography to form a pixel electrode 191.

According to this process, the complexity of the photolithography process is reduced compared with the first exemplary embodiment.

While the disclosed embodiments have been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims. In addition, many modifications can be made to adapt a particular situation or material to the teachings of this disclosure without departing from the essential scope thereof. Therefore, it is intended that this disclosure not be limited to the particular embodiment disclosed as the best mode contemplated for carrying out this disclosure.

What is claimed is:

1. A thin film transistor array panel comprising:
a substrate;
a gate electrode disposed on the substrate;
a data line disposed on the substrate;
a gate insulating layer disposed on the data line and the gate electrode, the gate insulating layer having a first contact hole exposing the gate electrode and a second contact hole exposing the data line;
a gate line disposed on the gate insulating layer, the gate line intersecting the data line and electrically connected to the gate electrode through the first contact hole;
a semiconductor disposed on the gate insulating layer, the semiconductor including a channel of a thin film transistor;
a source electrode disposed on the semiconductor, the source electrode electrically connected to the data line through the second contact hole;
a drain electrode disposed opposite to the source electrode with respect to the channel on the semiconductor;
a passivation layer disposed on the gate line, the source electrode, the drain electrode, and the channel of the semiconductor, the passivation layer having a third contact hole exposing the drain electrode; and
a pixel electrode formed on the passivation layer, the pixel electrode electrically connected to the drain electrode through the third contact hole.

2. The thin film transistor array panel of claim 1, further comprising:
a storage electrode line between the gate insulating layer and the passivation layer, the storage electrode line intersecting the data line and including a storage electrode.

3. The thin film transistor array panel of claim 2, wherein the storage electrode is disposed along the data line and covers the data line.

4. The thin film transistor array panel of claim 3, wherein the pixel electrode overlaps at least a portion of the storage electrode.

5. The thin film transistor array panel of claim 4, wherein the pixel electrode overlaps at least a portion of the data line.

6. The thin film transistor array panel of claim 5, wherein the gate line has an expansion, the expansion contacts the gate electrode through the first contact hole.

7. The thin film transistor array panel of claim 6, wherein the data line comprises an expansion, the expansion contacts the source electrodes through the second contact hole.

8. The thin film transistor array panel of claim 7, wherein the expansion of the gate line and the expansion of the data line oppose each other with respect to the channel of the semiconductor.

9. The thin film transistor array panel of claim 1, wherein the pixel electrode is disposed outside the region where the channel, the source electrode, and the gate electrode are disposed.

10. The thin film transistor array panel of claim 9, wherein the drain electrode comprises an extension parallel to the gate line, the extension overlaps the pixel electrode.

11. The thin film transistor array panel of claim 1, wherein the gate line has an expansion, the expansion contacts the gate electrode through the first contact hole.

12. The thin film transistor array panel of claim 11, wherein the data line has an expansion, the expansion contacts the source electrode through the second contact hole.

13. The thin film transistor array panel of claim 12, wherein the expansion of the gate line and the expansion of the data line oppose each other with respect to the channel of the semiconductor.

14. A method for manufacturing a thin film transistor array panel comprising:
disposing a gate electrode and a data line on a substrate;
disposing a gate insulating layer on the data line and the gate electrode;
patterning the gate insulating layer to form a first contact hole exposing the gate electrode, and a second contact hole exposing the data line;
disposing a semiconductor on the gate insulating layer, the semiconductor including a channel;
disposing a source electrode, the source electrode electrically connected to the data line through the second contact hole, a drain electrode opposite to the source electrode with respect to the channel, and a gate line, the gate line electrically connected to the gate electrode through the first contact hole on the gate insulating layer and the semiconductor;
disposing a passivation layer, the passivation layer having a third contact hole exposing the drain electrode on the gate line, the source electrode, the drain electrode, and the channel of the semiconductor; and
disposing a pixel electrode, the pixel electrode electrically connected to the drain electrode through the third contact hole on the passivation layer.

15. The method of claim 14, wherein the forming of the first and second contact holes of the gate insulating layer and the forming of the semiconductor comprise:
  disposing a semiconductor layer on the gate insulating layer;
  disposing a photosensitive film on the semiconductor layer; and
  patterning the photosensitive film with a half tone mask to form a first photosensitive film pattern exposing the semiconductor layer corresponding to the first contact hole and the second contact hole, and the first photosensitive film pattern comprises a first portion corresponding to the semiconductor and a second portion corresponding to the remaining portion, wherein the second portion has a thickness that is less than that of the first portion;
  etching the semiconductor layer and the underlying gate insulating layer using the first photosensitive film pattern as an etch mask to form the first contact hole and the second contact hole;
  etching the surface of the first photosensitive film pattern to form a second photosensitive film pattern to expose the semiconductor layer under the second portion; and
  etching the exposed semiconductor layer by using the second photosensitive film pattern as an etch mask.

16. The method of claim 15, wherein a storage electrode line, including a storage electrode, is disposed along the data line and covers the data line, wherein the storage electrode line is disposed during the disposing of the source electrode, the drain electrode, and the gate line.

17. The method of claim 16, further comprising:
  etching the upper portion of the semiconductor exposed between the source electrode and the drain electrode between the disposing of the source electrode, the drain electrode, and the gate line, and the disposing of the passivation layer.

18. The method of claim 14, wherein a storage electrode line, including a storage electrode, is disposed along the data line such that it covers the data line, and is disposed during the disposing of the source electrode, the drain electrode, and the gate line.

19. The method of claim 14, further comprising:
  etching the upper portion of the semiconductor exposed between the source electrode and the drain electrode between the disposing of the source electrode, the drain electrode, and the gate line, and the disposing of the passivation layer.

* * * * *